(12) United States Patent
Shi et al.

(10) Patent No.: US 6,326,640 B1
(45) Date of Patent: Dec. 4, 2001

(54) ORGANIC THIN FILM TRANSISTOR WITH ENHANCED CARRIER MOBILITY

(75) Inventors: Song Q. Shi, Phoenix; Chan-Long Shieh, Paradise Valley, both of AZ (US); Hsing-Chung Lee, Calabasas, CA (US)

(73) Assignee: Motorola, Inc., Schaumburg, IL (US)

( * ) Notice: Subject to any disclaimer, the term of this patent is extended or adjusted under 35 U.S.C. 154(b) by 873 days.

(21) Appl. No.: 08/592,930

(22) Filed: Jan. 29, 1996

(51) Int. Cl.[7] ............... H01L 35/24; H01L 51/00
(52) U.S. Cl. .................................................. 257/40
(58) Field of Search ...................................... 257/40

(56) References Cited

U.S. PATENT DOCUMENTS

| | | | |
|---|---|---|---|
| 4,106,951 | * 8/1978 | Masi | 136/89 NB |
| 5,468,519 | * 11/1995 | Akiyama et al. | 427/532 |
| 5,500,537 | * 3/1996 | Tsumura et al. | 257/40 |

FOREIGN PATENT DOCUMENTS

418504A2 * 3/1991 (EP) ........................................ 257/40

* cited by examiner

Primary Examiner—Tom Thomas
Assistant Examiner—Howard Weiss
(74) Attorney, Agent, or Firm—Eugene A. Parsons; William E. Koch

(57) ABSTRACT

An organic thin film transistor including a gate on a layer of gate insulator material, a source and a drain positioned in spaced apart relationship on a film of organic semiconductor material with uniaxially aligned molecules, the film of organic semiconductor material being positioned so that the molecules are aligned between the source and drain in a direction from the source to the drain, and an orientation film positioned adjacent the film of organic semiconductor material so that molecular uniaxial alignment of the film of organic semiconductor material is achieved by the orientation film.

24 Claims, 1 Drawing Sheet

ORGANIC THIN FILM TRANSISTOR WITH ENHANCED CARRIER MOBILITY

FIELD OF THE INVENTION

This invention relates to an organic thin film transistor (TFT) and more specifically to TFTs with enhanced carrier mobility.

BACKGROUND OF THE INVENTION

Organic TFTs are generally composed of in sequence a conductive gate electrode, a layer of gate insulator, a thin (less than 1 micron in thickness) layer of active (semiconductive) organic material and two laterally-spaced conductive strips as source and drain electrodes. The transistor can operate either in the enhancement or in the depletion mode depending on the polarity of the voltage applied to the gate electrode.

The first examples of organic TFTs were based on two organic conjugated polymers, polyacetylene (for example, F. Ebisawa et. al. J. Appl. phys. 54, 3255 (1983)) and polythiophene (for example, A. Assadi et. al. Appl. Phys. Lett. 53, 195 (1988)). Organic TFTs have also been fabricated with organic molecular semiconductors, such as metallophthalocyanines (for example, G. Guillaud et. al. Chem. Phys. Lett. 167, 503 (1990)) and α-sexithienyl (for example, X. Peng et. al. Appl. Phys. Lett. 57, 2013 (1990)).

In addition to low cost, abundance of raw materials, and the possibility of large-area applications by using the simple techniques of spin coating and vacuum evaporation, organic TFTs have the advantage of low process temperature, typically less then 200° C., as compared to conventional polycrystalline or amorphous silicon based thin film transistors, which generally require a process temperature above 350° C. The low process temperature allows organic TFTs to be fabricated on plastic substrates, which are generally vulnerable to high temperature. Organic TFTs on plastic substrates are attractive for portable, thin, light-weight, flexible active-matrix display applications such as plastic liquid crystal displays, plastic organic and inorganic electroluminescence displays.

Up to now, the development of organic TFTs has been hindered by the poor semiconducting properties of the organic materials used, exemplified by their carrier mobility value I as low as $10^{-4}$ to $10^{-5}$ cm$^2$V$^{-1}$s$^{-1}$. One of the best organic TFTs is based on α-sexithienyl reported by Garnier and co-worker with carrier mobility of $4.6 \times 10^{-1}$ cm$^2$V$^{-1}$s$^{-1}$ by manipulation of the gate insulator (Adv. Mater. 2, 592 (1990)). The result is comparable to those of hydrogenated amorphous silicon in a conventional MISFET, but the device is far from practical due to the hygroscopic property of the gate insulator used.

It is a purpose of this invention to disclose a new organic TFT structure that provides an organic TFT with enhanced carrier mobility.

It is another purpose of this invention to provide an organic TFT on plastic substrate for flexible, light-weight, large-area, display applications.

SUMMARY OF THE INVENTION

The above described problems and others are substantially solved and the above purposes and others are realized in an organic thin film transistor including a gate electrode, a layer of gate insulator material, a source electrode, a drain electrode and a layer of uniaxially aligned organic semiconductor material positioned between or underneath the source and drain electrodes in the direction from the source to the drain electrodes, wherein the alignment of the organic semiconductor is achieved by a layer of an orientation film positioned adjacent the organic semiconductor.

In the above organic TFTs, the alignment of organic semiconductor material between the source and the drain electrodes by the means of the orientation film enhances the carrier mobility from the source to the drain as compared to the un-aligned (random oriented) organic semiconductor.

BRIEF DESCRIPTION OF THE DRAWINGS

Referring to the drawings, wherein device feature dimensions are often in submicrometer ranges, so that the drawings are scaled for ease of visualization rather than dimensional accuracy.

DESCRIPTION OF THE PREFERRED EMBODIMENTS

The present invention is directed to an organic thin film transistor with an orientation film underneath the organic semiconductor for the purpose of aligning the organic semiconductor material to enhance the carrier mobility between the source and the drain electrodes.

Figure 1:
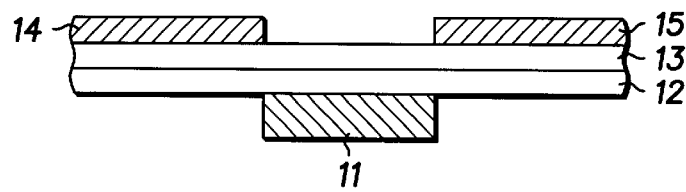
FIG. 1 is a cross section view of a conventional organic TFT structure.

As is illustrated in FIG. 1 a typical traditional organic TFT 10 includes a gate electrode 11 made of a stable metal, a metal alloy, or a transparent conductor such as indium-tin-oxide, a gate insulator 12 composed of a dielectric medium such as $SiO_x$, $SiN_x$, $AlO_x$ or organic polymeric dielectric medium, an organic semiconductor film 13 selected from either an organic polymeric semiconductor material or an organic molecular semiconductor material, and two laterally spaced conductive strips 14 and 15 made of a stable metal, a metal alloy, or a transparent conductor such as indium-tin-oxide, as a source and a drain electrode.

In the prior art, organic TFTs (e.g. TFT 10) generally suffer from poor device performance as compared to conventional polycrystalline, amorphous silicon transistors, mainly because of the very low carrier mobility encountered in the organic semiconductor films. One obvious way to overcome the problem is to make use of organic semiconductors with higher carrier mobility. This approach requires the tedious work of sieving through hundreds of known organic semiconductors, including labor-intensive designing, and inventing new organic semiconductors with higher carrier mobility.

In the prior art (e.g. TFT 10), the organic semiconductor molecules are randomly oriented in the as-formed organic semiconductor film 13. The carrier mobility is isotropic in all directions. However, many organic semiconductor materials are one-dimensional systems with anisotropic carrier mobility when the molecules are properly aligned or stacked. In a molecularly aligned organic polymeric semiconductor film with linear extended π-conjugated backbone such as in the case of polyacetylenes, polythiophenes, the carrier mobility along the conjugated bone direction is about 2 to 3 orders of magnitude higher then the carrier mobility along the perpendicular to the conjugated backbone direction. In a stacked organic molecular semiconductor with localized π-conjugation system such as in the case of perylene, tetracene, copper phthalocyanine, the carrier mobility along the molecule stacking direction with π-electron overlap is also 2–3 orders of magnitude higher then the carrier mobility along the perpendicular to the molecule stacking direction.

The present invention makes use of the anisotropy in carrier mobility in an organized organic semiconductor by aligning molecules in the organic semiconductor material in the thin film of an organic TFT in such a direction that the carrier mobility from source to drain is several times to several orders of magnitude higher then the carrier mobility in all other directions.

To illustrate the concept of the present invention, six variations of organic TFT structures are presented in the following as examples.

Figure 2:
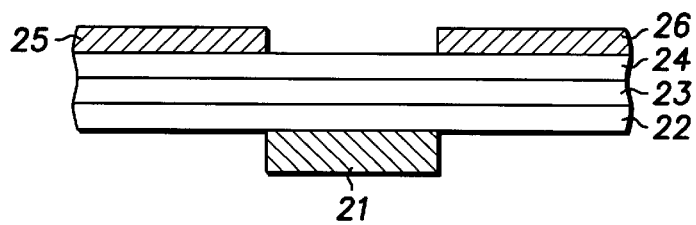
FIGS. 2,3,4,5,6 and 7 are cross sectional views of six variations of an organic TFT structure in accordance with the present invention.

Referring to FIG. 2, one embodiment of an organic TFT 20 in accordance with the present invention is illustrated. Organic TFT 20 includes a gate electrode 21 positioned on one surface of a layer of gate insulator material 22, which is composed of a dielectric medium. An orientation film 23 is positioned on the opposite surface of gate insulator material 22. A molecularly aligned organic semiconductor film 24 is positioned on the opposite surface of orientation film 23, and two laterally spaced apart conductive strips 25 and 26, as a source and a drain electrode, respectively, are positioned in laterally spaced apart relationship on the opposite surface of molecularly aligned organic semiconductor film 24.

Figure 3:
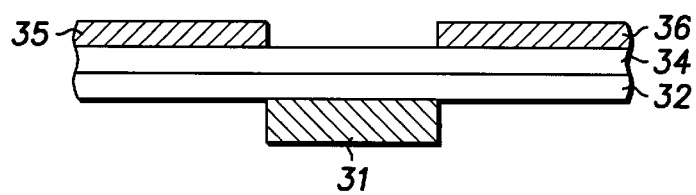

Referring now to FIG. 3, another embodiment comprising an organic TFT 30 is illustrated. Organic TFT 30 includes a gate electrode 31 positioned on one surface of a gate insulator 32 (a layer of dielectric medium) that also serves as an orientation film. A film 34 of an aligned organic semiconductor material is positioned with one surface on, or in abutting engagement with, the opposite surface of gate insulator/orientation layer 32. Two laterally spaced apart conductive strips 35 and 36 are positioned on the opposite surface of film 34, as a source and a drain electrode, respectively.

Figure 4:
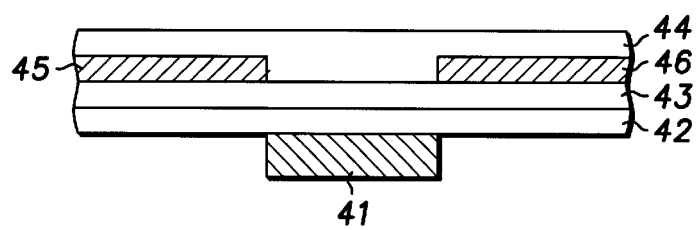

Referring now to FIG. 4, still another embodiment comprising an organic TFT 40 is illustrated. Organic TFT 40 includes a gate electrode 41 positioned on one surface of a gate insulator 42 (a layer of dielectric medium). An orientation film 43 is positioned on (or in abutting engagement with) the opposite surface of layer 42. Two laterally spaced apart conductive strips 45 and 46 are positioned on the opposite surface of orientation film 43, as a source and a drain electrode, respectively. A film 44 of an organic semiconductor material is positioned on orientation film 43 so as to surround, or cover, conductive strips 45 and 46. Film 44 is molecularly aligned between conductive strips 45 and 46.

Figure 5:
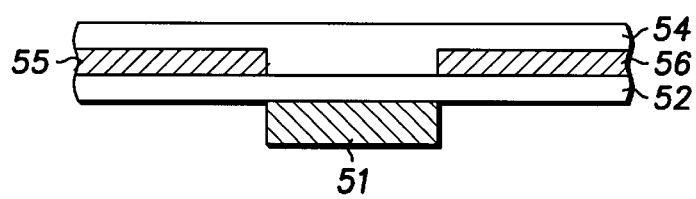

Referring now to FIG. 5, a further embodiment comprising an organic TFT 50 is illustrated. Organic TFT 50 includes a gate electrode 51 positioned on a gate insulator 52 (a layer of dielectric medium) that also serves as an orientation film. Two conductive strips 55 and 56 are positioned in laterally spaced apart relationship on the opposite surface of gate insulator/orientation film 52 as a source and a drain electrode. A film 54 of an organic semiconductor material is positioned over conductive strips 55 and 56 and gate insulator, orientation film 52 so as to be aligned between conductive strips 55 and 56.

Figure 6:
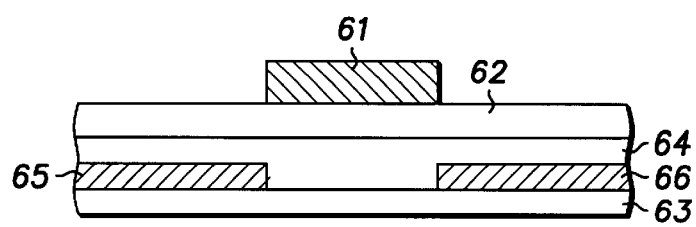

Referring to FIG. 6, still a further embodiment comprising an organic TFT 60 is illustrated. Organic TFT 60 includes an orientation film 63 with two laterally spaced apart conductive strips 65 and 66 positioned on an upper surface thereof as a source and a drain electrode. A film 64 of an organic semiconductor material is positioned on the upper surface of orientation film 63 so as to be aligned between conductive strips 65 and 66 and cover conductive strips 65 and 66. A gate insulator 62 is positioned on the upper surface of film 64 and a gate electrode 61 is positioned on the upper surface of layer 62.

Figure 7:
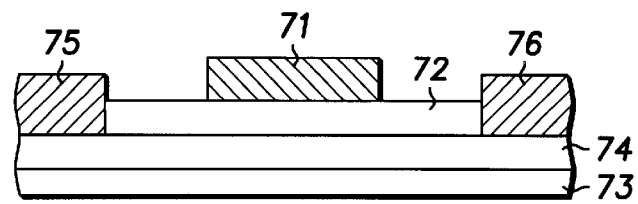

FIG. 7 illustrates still a further embodiment including an organic TFT 70. Organic TFT 70 is constituted of a layer of an orientation film 73 with a film 74 of an organic semiconductor aligned on top of orientation film 73. Two laterally spaced conductive strips 75 and 76 are positioned on the upper surface of film 74 as a source and a drain electrode. A layer of dielectric medium is deposited in-between conductive strips 75 and 76 as a gate insulator 72, and a gate electrode 71 is positioned on the top of gate insulator 72.

In each of the above embodiments, the gate, source and drain electrodes are made of materials selected from stable metals, metal alloys, or transparent conductors such as indium tin oxide. The gate insulators (22, 32, 42, 52, 62, 72) are constructed from materials selected from inorganic dielectric media such as $SiO_x$, $SiN_x$ and $AlO_x$, as well as organic dielectric media such as polyimides, polyacrylates, poly(vinyl chloride), perfluoropolymers and liquid crystal polymers. Also, the orientation films (23, 32, 43, 52, 63, 73) are selected from a variety of organic materials including polyimides, perfluoropolymers, liquid crystal polymers, etc. The thickness of the orientation films is in a range from 20 Å to 10 micron, and preferably less than 1000 Å in these specific embodiments.

Methods to achieve highly oriented thin films (i.e., films with molecules generally oriented in a direction parallel to the plane of the film) are known in the art. For example, in liquid crystal panel fabrication, a highly oriented polyimide thin film is obtained by rubbing the surface of the polymer coated substrate lightly in a single direction with a cotton cloth. Ueda and coworker (Y. Ueda, *Jpn. J. Appl. phys.* 34, 3876 (1995)) have also disclosed a method to attain highly oriented polytetrafluoroethylene thin films by rubbing mechanically. Also, a film of a liquid crystal polymer can be oriented by an electric or magnetic field pulling at temperature close to its glass transition temperature. The film maintains its orientation after it has been cooled to room temperature under the pulling electric or magnetic field. Akiyama et al. (U.S. Pat. No. 5,468,519, entitled "Method for Forming an Orientation Film Including Coupling an Organic Compound to a Silane Coupling Agent in a Magnetic or Electrical Field", issued Nov. 21, 1995) also disclosed a method for forming an orientation film including coupling an organic compound to a silane coupling agent in a magnetic or electric field.

In the specific embodiments disclosed, the orientation film acts as a foundation or seed for the organic semiconductor layer to grow or deposit uniaxially. The orientation direction of the orientation film should be arranged so that the film of organic semiconductor material aligned on the orientation film has the highest mobility in the source to drain electrode direction.

More specifically, as an example, if a film of an organic polymeric semiconductor material with linear extended π-conjugated backbone is used in the transistor, the orientation direction of the orientation film is preferentially controlled such that the film of organic polymeric semiconductor material grows or deposits on top of the orientation film with extended π-conjugated backbone aligned in the source to the drain electrode direction. In another example, if a film of an organic molecular semiconductor material with localized π-conjugation systems is used, the orientation direction of the orientation film is preferentially controlled such that the film of organic molecular semiconductor material grows or deposits on top of the orientation film with the molecule stacking with π-electron overlapping aligned in the source to the drain electrode direction.

Thin films (i.e., layers 24, 34, 44, 54, 64, 74) of organic polymeric semiconductor materials used in this embodiment include but are not limited to: conjugated hydrocarbon polymers such as polyacetylene, polydiacetylene, polyacene, polyphenylene, poly(phenylene vinylene), and the derivatives including oligomers of those conjugated hydrocarbon polymers; conjugated heterocyclic polymers such as polyaniline, polythiophene, polypyrrole, polyfuran, polypyridine, poly(thienylene vinylene) and alike, and the derivatives including oligomers of those conjugated heterocyclic polymers. Also, thin films of organic molecular semiconductor materials used in this embodiment include but are not limited to: condensed aromatic hydrocarbons such as tetracene, chrysene, pentacene, pyrene, perylene, coronene, and the derivatives of those condensed aromatic hydrocarbons; metal complexes of porphine and phthalocyanine type of compounds such as zinc 1,10,15,20-tetraphenyl-21 H, 23 H-porphine, copper phthalocyanine, lutetium bisphthalocyanine, aluminum phthalocyanine chloride.

A substrate (not shown) may be utilized which comprises any of a variety of materials including: inorganic materials such as silicon, ceramic, glass and organic plastic materials such as poly(vinylene chloride)s, polyolefins may be used to support the embodied organic TFT. However, the present invention is particularly useful for organic plastic substrates, where polycrystalline and amorphous silicon TFTs can not normally be fabricated, since the temperature required to process the embodied organic TFTs is generally less then 200° C.

Thus, a variety of organic TFTs have been disclosed with enhanced carrier mobility. The TFTs are relatively simple and inexpensive to fabricate, with only one additional layer, in some embodiments and no additional layers in other embodiments. It is an intention of this invention to provide an organic TFT with improved carrier mobility on plastic substrate for flexible, light-weight, large-area, display applications While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An organic thin film transistor comprising:
a gate electrode positioned on a layer of gate insulator material;
a source electrode and a drain electrode positioned in spaced apart relationship on a film of organic semiconductor material with uniaxially aligned molecules, the film of organic semiconductor material being positioned so that the uniaxially aligned molecules are aligned between the source and drain electrodes in a direction from the source to the drain electrodes, the layer of gate insulator material being operatively positioned adjacent to and in parallel with the film of organic semiconductor material; and
an orientation film positioned adjacent the film of organic semiconductor material so that molecular uniaxial alignment of the film of organic semiconductor material is achieved by the orientation film positioned adjacent the film of organic semiconductor material.

2. An organic thin film transistor as claimed in claim 1 wherein the gate electrode is composed of a material selected from one of the following: stable metals, metal alloys, and transparent conductors including indium tin oxide.

3. An organic thin film transistor as claimed in claim 1 wherein the source and drain electrodes are composed of a material selected from one of the following: stable metals, metal alloys, and transparent conductors including indium tin oxide.

4. An organic thin film transistor as claimed in claim 1 wherein the gate insulator is composed of an inorganic dielectric medium selected from SiOx, SiNx, AlOx.

5. An organic thin film transistor as claimed in claim 1 wherein the gate insulator is composed of an organic dielectric medium selected from polyimides, polyacrylates, poly (vinyl chloride), perfluoropolymers.

6. An organic thin film transistor as claimed in claim 1 wherein the organic semiconductor material includes organic polymeric semiconductor materials selected from conjugated hydrocarbon polymers such as polyacetylene, polydiacetylene, polyacene, polyphenylene, poly(phenylene vinylene), and the derivatives including oligomers of those conjugated hydrocarbon polymers; conjugated heterocyclic polymers such as polyaniline, polythiophene, polypyrrole, polyfuran, polypyridine, poly(thienylene vinylene) and alike, and the derivatives including oligomers of those conjugated heterocyclic polymers.

7. An organic thin film transistor as claimed in claim 6 wherein the orientation film is oriented such that the organic polymeric semiconductor material used in the transistor is positioned adjacent the orientation film with extended π-conjugated backbone aligned in a source to drain electrode direction.

8. An organic thin film transistor as claimed in claim 1 wherein the organic semiconductor material includes organic molecular semiconductor material selected from condensed aromatic hydrocarbons such as tetracene, chrysene, pentacene, pyrene, perylene, coronene, and the derivatives of those condensed aromatic hydrocarbons; metal complexes of porphine and phthalocyanine type of compounds such as zinc 1,10,15,20-tetraphenyl-21 H, 23 H-porphine, copper phthalocyanine, lutetium bisphthalocyanine, aluminum phthalocyanine chloride.

9. An organic thin film transistor as claimed in claim 7 wherein the orientation film is oriented that the organic molecular semiconductor material is positioned adjacent the orientation film with the molecule stacking with π-electron overlapping aligned in a source to drain electrode direction.

10. An organic thin film transistor as claimed in claim 1 wherein the orientation film is selected to achieve orientation by one of the following methods: mechanically rubbing, electric field pulling, magnetic field pulling.

11. An organic thin film transistor as claimed in claim 1 wherein the orientation film is oriented such that the organic semiconductor material aligned on the orientation film has the highest mobility in a source to drain electrode direction.

12. An organic thin film transistor as claimed in claim 1 wherein the orientation film is composed of materials selected from polyimides, perfluoropolymers, liquid crystal polymers.

13. An organic thin film transistor as claimed in claim 1 wherein the orientation film is included in the layer of gate insulator material.

14. An organic thin film transistor comprising:
a gate electrode positioned on a layer of gate insulator material;
a source electrode and a drain electrode positioned in spaced apart relationship on a film of organic semiconductor material with uniaxially aligned molecules, the film of organic semiconductor material being positioned so that the uniaxially aligned molecules are aligned between the source and drain electrodes in a direction from the source to the drain electrodes, the layer of gate insulator material being positioned in abutting engagement with the film of organic semiconductor material; and
an orientation film positioned adjacent the film of organic semiconductor material so that molecular uniaxial alignment of the film of organic semiconductor material is achieved by the orientation film positioned adjacent the film of organic semiconductor material.

15. An organic thin film transistor as claimed in claim 14 wherein the gate electrode is composed of a material selected from one of the following: stable metals, metal alloys, and transparent conductors including indium tin oxide.

16. An organic thin film transistor as claimed in claim 14 wherein the source and drain electrodes are composed of a material selected from one of the following: stable metals, metal alloys, and transparent conductors including indium tin oxide.

17. An organic thin film transistor as claimed in claim 14 wherein the organic semiconductor material includes organic polymeric semiconductors selected from conjugated hydrocarbon polymers such as polyacetylene, polydiacetylene, polyacene, polyphenylene, poly(phenylene vinylene), and the derivatives including oligomers of those conjugated hydrocarbon polymers; conjugated heterocyclic polymers such as polyaniline, polythiophene, polypyrrole, polyfuran, polypyridine, poly(thienylene vinylene) and alike, and the derivatives including oligomers of those conjugated heterocyclic polymers.

18. An organic thin film transistor as claimed in claim 17 wherein the orientation film is oriented such that the organic polymeric semiconductor material used in the transistor and positioned on the layer of gate insulator material is positioned with extended $\pi$-conjugated backbone aligned in a source to drain electrode direction.

19. An organic thin film transistor as claimed in claim 14 wherein the organic semiconductor material includes organic molecular semiconductor materials selected from condensed aromatic hydrocarbons such as tetracene, chrysene, pentacene, pyrene, perylene, coronene, and the derivatives of those condensed aromatic hydrocarbons; metal complexes of porphine and phthalocyanine type of compounds such as zinc 1,10,15,20-tetraphenyl-21 H, 23 H-porphine, copper phthalocyanine, lutetium bisphthalocyanine, aluminum phthalocyanine chloride.

20. An organic thin film transistor as claimed in claim 19 wherein the orientation film is oriented such that the organic molecular semiconductor material positioned on the layer of gate insulator material is positioned with the molecule stacking with $\pi$-electron overlapping aligned in a source to drain electrode direction.

21. An organic thin film transistor as claimed in claim 14 wherein the orientation film achieves its orientation by one of the following methods: mechanically rubbing, electric field pulling, magnetic field pulling.

22. An organic thin film transistor as claimed in claim 14 wherein the orientation film is oriented such that the organic semiconductor material aligned on the orientation film has the highest mobility in a source to drain electrode direction.

23. An organic thin film transistor as claimed in claim 14 wherein the orientation film is composed of materials selected from polyimides, perfluoropolymers, and liquid crystal polymers.

24. An organic thin film transistor comprising:
a gate electrode positioned on a layer of gate insulator material;
a source electrode and a drain electrode positioned in spaced apart relationship on a film of organic semiconductor material with uniaxially aligned molecules, the film of organic semiconductor material being positioned so that the uniaxially aligned molecules are aligned between the source and drain electrodes in a direction from the source to the drain electrodes; and
an orientation film positioned with a first surface in abutting engagement with the film of organic semiconductor material and a second surface in abutting engagement with the layer of gate insulator material so that molecular uniaxial alignment of the film of organic semiconductor material is achieved by the orientation film.

* * * * *